(12) United States Patent
Cremer et al.

(10) Patent No.: US 7,796,372 B2
(45) Date of Patent: Sep. 14, 2010

(54) MANUFACTURE OF 3 DIMENSIONAL MIM CAPACITORS IN THE LAST METAL LEVEL OF AN INTEGRATED CIRCUIT

(75) Inventors: Sébastien Cremer, Sassenage (FR); Jean-Christophe Giraudin, Saint Nazaire les Eymes (FR); Emmanuelle Serret, Vaulnaveys Lehaut (FR)

(73) Assignee: STMicroelectronics SA, Montrouge (FR)

( * ) Notice: Subject to any disclaimer, the term of this patent is extended or adjusted under 35 U.S.C. 154(b) by 351 days.

(21) Appl. No.: 12/061,167

(22) Filed: Apr. 2, 2008

(65) Prior Publication Data
US 2008/0239618 A1 Oct. 2, 2008

(30) Foreign Application Priority Data
Apr. 2, 2007 (FR) .................................. 07 54216

(51) Int. Cl.
*H01G 5/00* (2006.01)
(52) U.S. Cl. ..................... 361/287; 361/272; 361/277; 361/281; 361/290; 361/292
(58) Field of Classification Search .............. 361/287, 361/272–273, 277–278, 281, 283.3, 290, 361/292
See application file for complete search history.

(56) References Cited

U.S. PATENT DOCUMENTS 5,926,359 A * 7/1999 Greco et al. ............... 361/311
6,025,226 A * 2/2000 Gambino et al. ............ 438/244
6,180,976 B1 * 1/2001 Roy ........................... 257/306
6,197,650 B1 * 3/2001 Wu ............................. 438/386
6,236,079 B1 * 5/2001 Nitayama et al. ........... 257/306
6,251,740 B1   6/2001 Johnson et al. ............. 438/381
6,306,719 B1 * 10/2001 Lee ............................ 438/387
6,441,419 B1   8/2002 Johnson et al. ............. 257/296
6,909,589 B2 * 6/2005 Huff ........................... 361/281
2001/0020713 A1   9/2001 Yoshitomi et al. .......... 257/306
2002/0163029 A1  11/2002 Dirnecker et al. .......... 257/306
2003/0183862 A1  10/2003 Jin et al. .................... 257/301
2004/0232557 A1  11/2004 Kim ........................... 257/758
2006/0076596 A1   4/2006 Ohkubo et al. ............. 257/296

FOREIGN PATENT DOCUMENTS

FR   2 884 646    10/2006
GB   2390223 A    12/2003

OTHER PUBLICATIONS

Ruichen Liu et al., "Single Mask Metal-Insulator-Metal (MIM) Capacitor with Copper Damascene Metallization for Sub-0.18 μm Mixed Mode Signal and System-on-a-Chip (SoC) Applications," Proceedings of the IEEE International Interconnect Technology Conference, IEEE Piscataway, NJ, USA, 2000, pp. 111-113.

* cited by examiner

*Primary Examiner*—Nguyen T Ha
(74) *Attorney, Agent, or Firm*—Lisa K. Jorgenson; Allen, Dyer, Doppelt, Milbrath & Gilchrist, P.A.

(57) ABSTRACT

A method is for fabricating an integrated circuit formed from a substrate and including several metallic interconnection levels in which, in a same plane parallel to the main plane of the substrate, is a plurality of thick horizontal metallic interconnection lines, as well as one or several MIM capacitors fitted with metallic electrodes that are orthogonal to the main plane of the substrate.

21 Claims, 8 Drawing Sheets

US 7,796,372 B2

MANUFACTURE OF 3 DIMENSIONAL MIM CAPACITORS IN THE LAST METAL LEVEL OF AN INTEGRATED CIRCUIT

FIELD OF THE INVENTION

The invention relates to the field of microelectronics and in particular, to that of 2 or 3 dimensional MIM (Metal-Insulator-Metal) capacitors in integrated circuits.

It covers the manufacture of an integrated circuit formed from a substrate and comprising several metallic interconnection levels in which, in a plane parallel to the main plane of the substrate, is a plurality of thick horizontal metallic lines, as well as one or several MIM capacitors fitted with metallic electrodes, featuring portions that are orthogonal to the main plane of the substrate and portions that are parallel to the main plane of the substrate. The invention has applications in particular in the field of integrated circuits fitted with at least one RF and/or analog module.

The invention provides improvements in terms of the capacity and/or density of integration of the MIM capacitors in an integrated circuit, and adapts to the integrated circuit technologies in which the thickness of the dielectric between the horizontal metallic interconnection lines is very thin. The invention also enables reducing the level of defects in an integrated circuit fitted with MIM capacitors.

BACKGROUND OF THE INVENTION

There are different methods of incorporating capacitors into an integrated electronic circuit. Certain methods lead to the fabrication of a capacitor fitted with metallic electrodes parallel to the main plane of the substrate, and of which the upper electrode is located, for example, in the last metallic interconnection levels. Such a capacitor, in order to have a high capacity, occupies a portion of the surface area projected onto the substrate that is just as high. The resulting size makes it more difficult to incorporate metallic tracks and vias in the interconnection layers.

Capacitors with "vertical" electrodes, of which the electrodes are orthogonal to the main plane of the substrate, have also been made. These capacitors are generally formed using a Damascene type process, by filling trenches with a MIM stack comprising a thin metallic layer, a thin insulating layer and another thin metallic layer. These capacitors generally have a limited capacity.

In FIG. 1, a micro-electronic device fitted with at least one 3 dimensional MIM (Metal-Insulator-Metal) capacitor called "3D MIM" is illustrated. This device is fitted with at least one 3 dimensional capacitor designed both to satisfy the demands in terms of its reduced size and high capacity. This capacitor features portions of electrodes orthogonal to the main plane of the substrate and portions of electrodes parallel to the main plane of the substrate.

The device is formed from a substrate 1, on which a plurality of components and superposed metallic interconnection levels, for example 6 metallic interconnection levels L1, L2, L3, L4, L5, L6 (the components and the 4 first metallic interconnection levels L1, . . . , L4, which are shown diagrammatically in FIG. 1 by a block in dotted lines above the substrate 1) have been created. This capacitor 2 is fitted with a first electrode featuring a "vertical" section formed in a plane that is orthogonal to the main plane of the substrate 1, from a first thin metallic layer 3, a second electrode featuring a "vertical" section formed in a plane orthogonal to the main plane of the substrate 1, from a second thin metallic layer 5 separated from the first thin metallic layer 3 by a thin layer of dielectric material 4, wherein the first thin metallic layer 3, the thin dielectric layer 4 and the second thin metallic layer 5 cover the walls. The bottom of the trenches is made in an insulating layer 6 in which metallic vias 7 connecting the fifth metallic level L5 and the sixth metallic level L6 are created. The electrodes of the capacitor also feature sections of horizontal electrodes formed at the bottom of the trenches from metallic layers 3 and 5 between the metallic layers 8 and 9 respectively of the 5th level and 6th level.

The metallic layer 8, on which the MIM stack rests at the bottom of the trenches, is generally copper based. When creating this metallic layer 8, the copper induces stresses which tend to cause, after the copper is deposited, the formation of hillocks on the surface of this metallic section 8. These hillocks tend to cause manufacturing defects in sections of the device located above the 5th metal level and to downgrade the electrical performances of the MIM capacitor, especially in terms of breakdown voltage.

The defects caused are furthermore greater the larger the surface of the metallic section 8.

There is the issue of improving the capacity of the integrated MIM 3 dimensional capacitors, while conserving a satisfactory integration density in the integrated circuit in which these capacitors are made. Furthermore, there is the issue of reducing the number of defects in the integrated circuits fitted with MIM capacitors.

SUMMARY OF THE INVENTION

The invention relates to a fabrication method of a microelectronic device fitted with one or several 3 dimensional capacitors including:

a) forming on a substrate, a plurality of components and a plurality of metallic levels superposed on and interconnecting the components, b) forming at least one insulating layer on another insulating layer featuring one or more vertical connection elements of a given height resting on a first horizontal metallic strip of a metallic interconnection level, c) making, opposite at least one second horizontal metallic strip belonging to the metallic interconnection level and located in a same plane parallel to the main plane of the substrate as the first horizontal metallic strip, one or several trenches passing through the given insulating layer, and d) covering the walls and the bottom of the trenches with a stack formed by at least one first thin metallic layer in contact with the walls, at least one thin dielectric layer on the first thin metallic layer, and at least one second thin metallic layer on the thin dielectric layer.

The given insulating layer may have a thickness greater than the given height of the vertical metallic interconnection elements. The method may further comprise, after step d), a step e) including: filling the trenches covered by the stack with layers of at least one metallic material, such as copper.

The method may further comprise after step b), steps comprising:

c') making at least one trench opposite the first horizontal metallic strip and revealing the vertical connection elements, and d') filling the trench with one or several metallic materials.

According to one first possibility, steps c') and d') may be carried out once steps c) and d) have been completed. According to another possibility, steps c) and d) may be carried out once steps c') and d') have been completed.

The method may further comprise the creation of one or several contact pads, for example aluminium pads, of which at least one pad is in contact with at least one trench filled with metallic material, for example copper.

In step c), at least one trench may reveal a metallic element resting on the second metallic strip, wherein at least one second trench reveals a second metallic element resting on the second metallic strip.

According to another embodiment of the method, in step c), at least two trenches may reveal a same metallic block resting on the second metallic strip.

Alternatively, in step c), at least one trench may reveal the second metallic strip, wherein the trenches made in step c) also pass through the other insulating layer.

The given insulating layer may have a thickness greater than 0.9 µm. The other insulating layer may have a thickness of less than 3 µm.

A micro-electronic device may be fitted with one or more 3 dimensional capacitors, and may include a substrate and a plurality of metallic interconnection levels superposed on the substrate and featuring respectively one or several horizontal metallic strips. There may be at least one given horizontal metallic strip of a given metallic interconnection level, formed in the thickness of a given insulating layer, wherein one or several trenches pass through the thickness of the given insulating layer. The trenches may be fitted respectively with walls covered by a stack formed of at least one first thin metallic layer in contact with the walls, at least one thin dielectric layer, and at least one second thin metallic layer in contact with the thin dielectric layer. The given metallic strip may be connected to at least one first horizontal metallic strip of a metallic level lower than the given metallic level, by one or several vertical connection elements inserted in another insulating layer. The first thin metallic layer may be capable of forming at least one section of a first electrode of at least one capacitor, while the second thin metallic layer may be capable of forming at least one section of a second electrode of the capacitor.

The vertical connection elements may have a height that is less than the thickness of the given insulating layer. The trenches may further be filled with at least one given metallic material, for example copper in contact with the second thin metallic layer.

The given metallic level may be the last level of the plurality of superposed metallic levels, and the device may further comprise a plurality of metallic contact pads formed on the given metallic level. The metallic contact pads may be based on a metal resistant to the oxidation phenomenon, such as aluminium applied to the surface of the micro-electronic device.

The trenches may respectively have a bottom covered by the stack, wherein the first thin metallic layer of the stack is at the bottom of the trenches, connected to at least one second horizontal metallic strip belonging to the lower metallic level. The second horizontal metallic strip and the first horizontal metallic strip may be located in a same plane parallel to the main plane of the substrate.

According to a first possibility, at the bottom of at least one trench, the first thin metallic layer of the stack may be in contact with at least one metallic element passing through the other insulating layer and resting on the second horizontal metallic strip, at the bottom of at least one other trench among the trenches. The first thin metallic layer of the stack may be in contact with at least one other metallic element passing through the other insulating layer and resting on the second horizontal metallic strip.

According to a second possibility, at the bottom of at least one trench, the first thin metallic layer of the stack may be in contact with at least one metallic block passing through the other insulating layer and resting on the second horizontal metallic strip, at the bottom of at least one other trench among the trenches. The first thin metallic layer of the stack may be in contact with the metallic block.

According to a third possibility, the trenches may further pass through the other insulating layer, and the first thin metallic layer of the stack may be at the bottom of the trenches, in contact with the second horizontal metallic strip.

The given insulating layer may have a thickness greater than 0.9 µm. The other insulating layer may have a thickness of less than 3 µm.

This approach also relates to an integrated circuit comprising a device such as that previously defined and fitted with one or several RF and/or analog modules.

BRIEF DESCRIPTION OF THE DRAWINGS

This invention will be more clearly understood after reading the description of embodiments provided purely by way of example and in no way restrictively, in reference to the appended drawings among which.

DETAILED DESCRIPTION OF THE PREFERRED EMBODIMENTS

Similar or equivalent parts to those of the various figures bear the same numerical references so as to facilitate changing from one figure to another, and the various parts shown in the figures are not necessarily to a uniform scale, to make the figures easier to read.

One example of a manufacturing method of a micro-electronic device will now be provided with reference to FIGS. 2A-2D.

The initial material of this method may be an integrated circuit being manufactured, for example, a circuit comprising at least one module dedicated to radio-frequency and/or analog applications. This circuit comprises a substrate 100, on which a plurality of components have been formed and may be already fitted with a plurality of superposed metallic interconnection levels, for example five metallic interconnection levels M1, M2, M3, M4, M5 (the components and the four first metallic interconnection levels M1, . . . , M4, are represented by a block in dotted lines in FIGS. 2A-2D) each featuring at least one or several metallic lines or horizontal metallic strips. Throughout this description, by "horizontal" lines or strips it is meant lines or strips extending in a plane parallel to the main plane of the substrate 100, wherein the main plane of the substrate 100 is defined as a plane passing through the substrate and parallel to the plane [O;$\vec{i}$;$\vec{j}$] with an orthogonal identifier of [O;$\vec{i}$;$\vec{j}$;$\vec{k}$] shown in FIGS. 2A-2D. The fifth metallic level M5 of interconnections features a plurality of horizontal lines or strips based on a metallic material, for example copper.

Figure 2A:
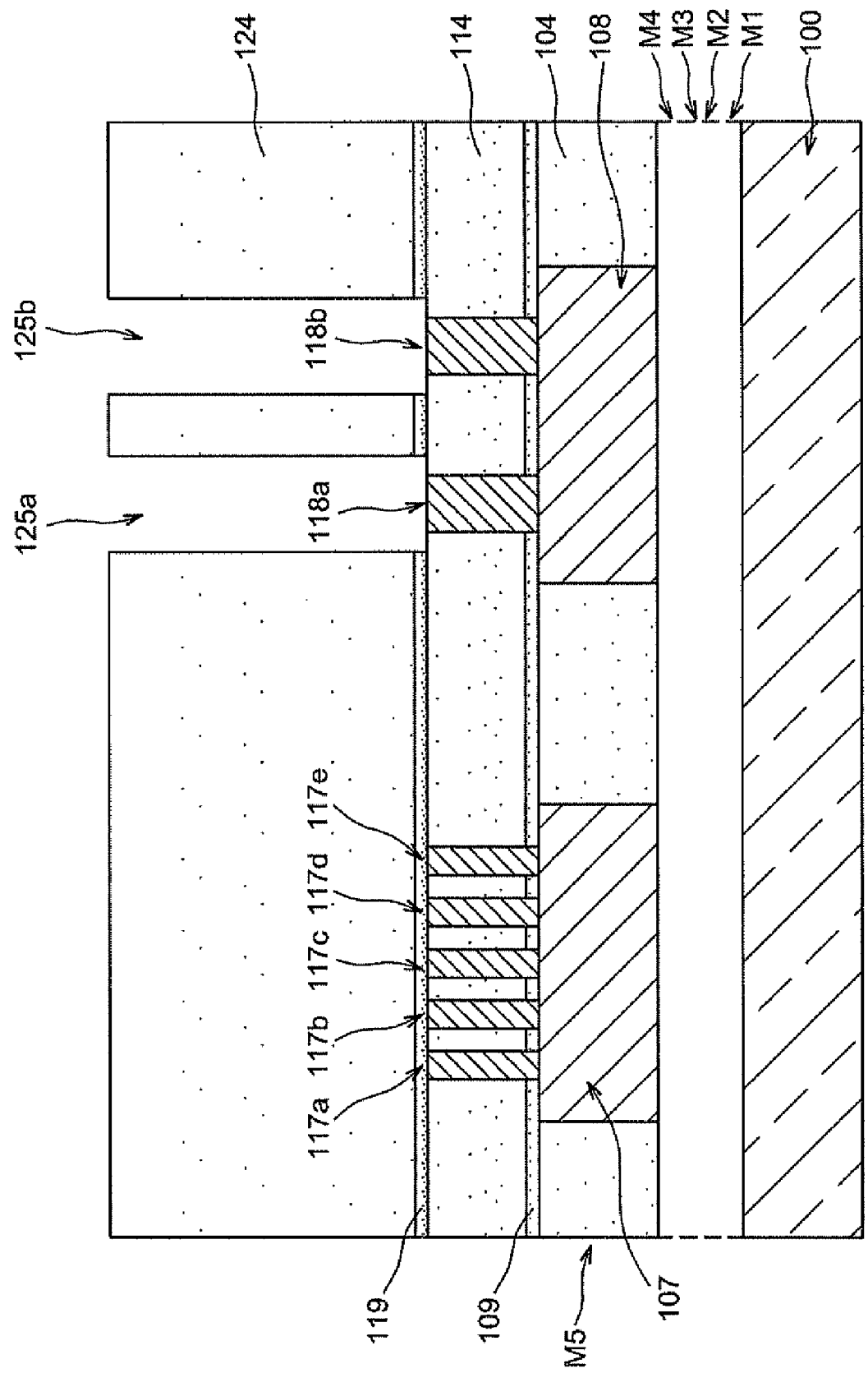
FIGS. 2A-2D, illustrate one example of the method according to the invention, for the creation of a device fitted with one or several MIM 3 dimensional capacitors.

In FIG. 2A, part of this fifth metallic level M5, featuring a first horizontal metallic strip 107 and a second horizontal metallic strip 108, is shown. The first metallic strip 107 and the second horizontal metallic strip 108 are situated in a dielectric material 104 based layer, for example, $SiO_2$ or SiOC bases with a thickness of between 0.1 μm and 3 μm, for example around 0.2 μm. On the conductive strips 107, 108 are respectively formed the vertical metallic interconnection elements 117a, 117b, 117c, 117d, 117e, 118a, 118b, commonly called "vias". Throughout this description, by "vertical" elements it is meant elements extending in a direction that is orthogonal or substantially orthogonal to the main plane of the substrate 100.

The vertical metallic elements 117a, 117b, 117c, 117d, 117e, 118a, 118b, may have been formed in the entire thickness of an insulating layer 114, for example by a method during which, in the insulating layer 114, holes are made opposite the first metallic conductive strip 107 and opposite the second metallic conductive strip 108, followed by the filling of the holes, by at least one metallic material such as copper. Mechanical-chemical polishing may be carried out, so as to reduce the excess metallic material protruding from the mouth of the holes and resting on the insulating layer 114.

The insulating layer 109-114 in which the vertical metallic interconnection elements 117a, 117b, 117c, 117d, 117e, 118a, 118b, are inserted, may be formed by a thin sub-layer 109, which acts as a barrier to diffusion, based on a dielectric material, for example $Si_3N_4$, or SiCN, covered by a second sub-layer of dielectric material 114, for example $SiO_2$ or SiOC based. The insulating layer 114 may have a thickness of between for example 0.1 and 3 μm. The vertical metallic elements 117a, 117b, 117c, 117d, 117e, 118a, 118b, formed in the insulating layer 109-114 may have a height h (measured in a direction parallel to that of the vector $\vec{k}$ of the identifier [O;$\vec{i}$;$\vec{j}$;$\vec{k}$]) substantially equal to the thickness of the insulating layer 109-114. The vertical metallic elements 117a, 117b, 117c, 117d, 117e, 118a, 118b, may have a critical dimension for example of around 0.3 μm or 0.4 μm. By critical dimension, it is meant the smallest dimension of an element measured in a direction parallel to the main plane of the substrate 100.

Once the vertical metallic elements 117a, 117b, 117c, 117d, 117e, 118a, 118b, have been made, another insulating layer 119-124 may be formed. The other insulating layer 119-124 may be made by depositing a thin sub-layer 119, which acts as a barrier to diffusion, based on a dielectric material, for example $Si_3N_4$ or SiCN onto which a second sub-layer of dielectric material 114 is deposited, for example $SiO_2$ or SiOC based. The insulating layer 119-124 may be provided with a significant thickness, to accommodate a sixth metallic level M6 featuring lines or horizontal metallic strips of a significant thickness. The sixth metallic level M6 may be provided with a significant thickness of metal, greater than the height of the vias 117a, 117b, 117c, 117d, 117e, 118a, 118b, suited for RF and/or analog applications. The sixth metallic level MG may be a level in which a significant thickness of metal is required, in order to make components such as inductances for example, with a high quality factor Q, or metallic tracks that may be used to transport a high current density, are designed to be made. By significant thickness, it is meant a thickness for example at least greater than 0.9 micrometers.

The other insulating layer 119-124 may be provided with a thickness greater than the thickness of the insulating layer 109-114 in which the vias 117a, 117b, 117c, 117d, 117e, 118a, 118b, have been made. By "significant" thickness, it is meant, for example, that the thickness of the other insulating layer 119-124 is greater than 0.9 μm. The other insulating layer 119-124 may have a thickness for example of between 0.9 μm and 10 μm, for example of around 3 μm or 4 μm.

Then, opposite the second horizontal metallic strip 108, belonging to the metallic level M5 and located in a same plane parallel to the main plane of the substrate 100 as the first metallic strip 107, trenches 125a, 125b, may be made which pass through the other insulating layer 119-124, and which each reveal a conductive element 118a, 118b. The trenches 125a, 125b, may be made with the aid of at least one photolithographic and etching step (FIG. 2A).

Next a MIM (Metal-Insulator-Metal) stack may be deposited so as to cover the walls and the bottom of the trenches 125a, 125b. The MIM stack may be made by depositing a first thin metallic layer 130, for example TiN or TaN based covering the walls and the bottom of the trenches 125a, 125b, of a thickness for example of around one or several tens of nanometers. Then, a thin layer of dielectric material 132 of a thickness, for example, of around one or several nanometers may be deposited on the first thin metallic layer 130. The thin layer of dielectric material 132 may be for example $Al_2O_3$ or $HfO_2$ or $Si_3N_4$ based, or $Ta_2O_5$ based or a combination of the above materials.

Figure 2B:
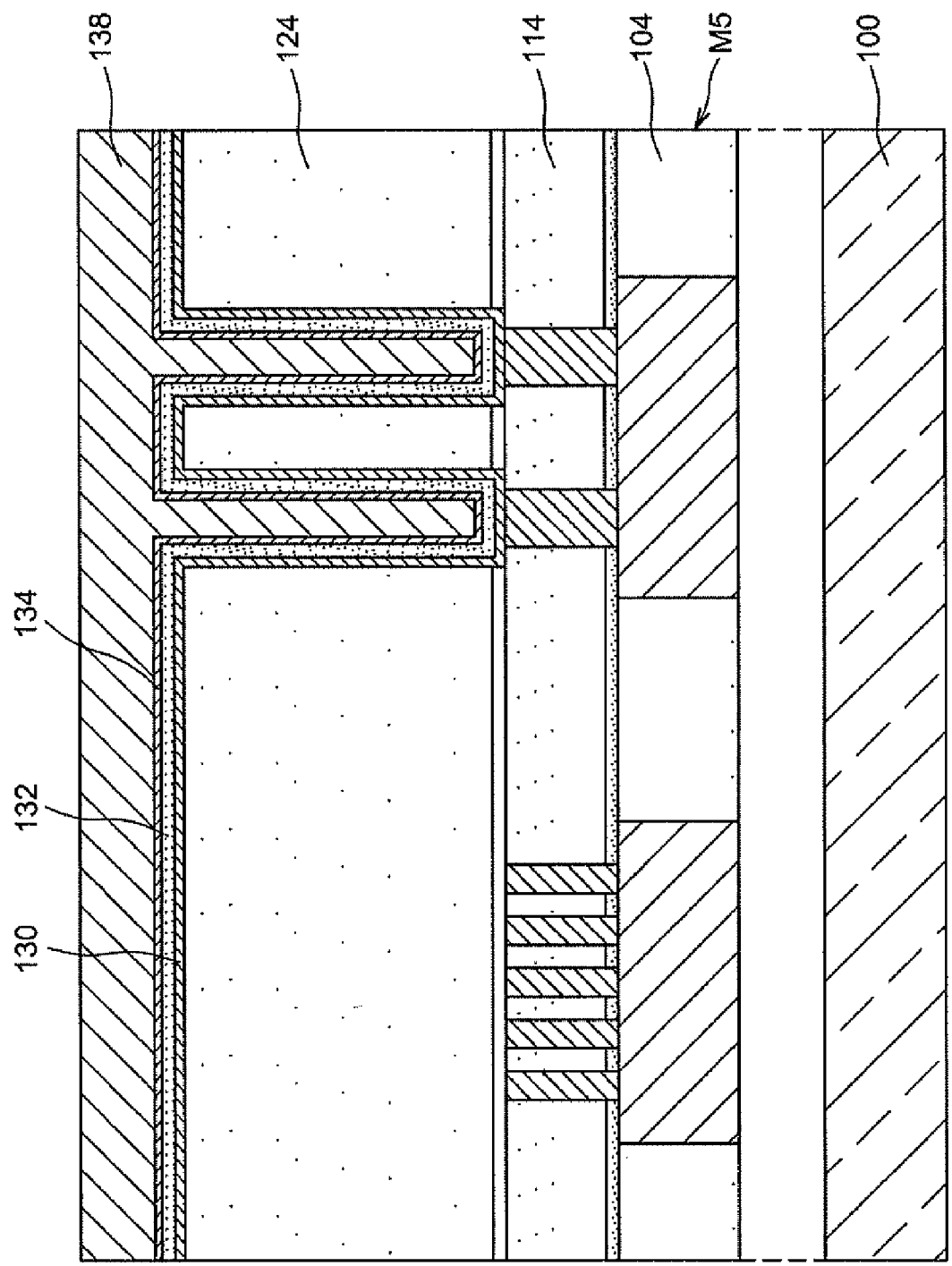

Next, a second thin metallic layer 134 for example TiN or TaN based of a thickness for example of around one or several tens of nanometers, is deposited on the thin layer of dielectric material 132. Next, the trenches covered by the MIM stack of layers 130, 132, 134, may be filled with at least one metallic material 138, for example, copper (FIG. 2B).

Then the layers 130, 132, 134, may be recovered as well as the metallic material 138 in a zone located above the upper face of the layer of dielectric material 124. This removal may be made using chemical-mechanical polishing (CMP) until the upper face of the layer of dielectric material 124 is reached.

Figure 2C:
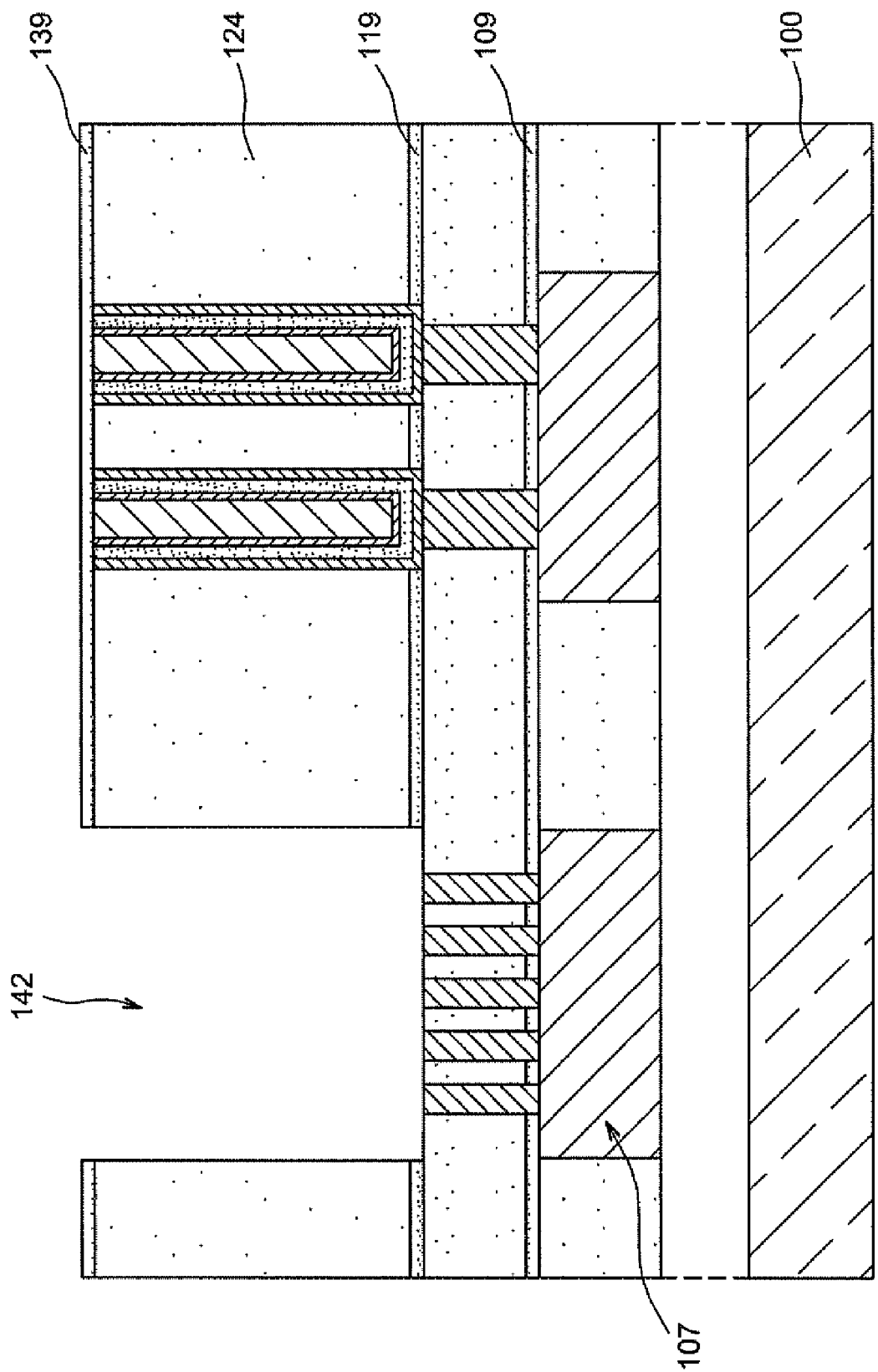

A thin layer of dielectric material 139, of a Thickness, for example, of around 500 angstroms, and for example, $Si_3N_4$ based, may be then deposited onto the layer of dielectric material 124. Next, one or several trenches may be formed though the dielectric layers 139, 124, 119, for example with at least one photolithographic and etching step. Among the trenches made is at least one trench 142 opposite the first metallic strip 107 of the metallic level M5, wherein the trench 142 reveals the vertical metallic elements 117a, 117b, 117c, 117d, 117e. In the trench 142, a thin metallic layer 145, which acts as a barrier to diffusion, may then be deposited, for example TaN based and of a thickness of around 100 angstroms, so as to cover the walls and the bottom of the trench 142 (FIG. 2C).

Then the trench 142 may be filled in using at least one metallic material 146, for example copper. The trench 142 filled with metallic material forms a thick horizontal metallic strip 147 of the sixth metallic level M6. A chemical-mechanical polishing step may then be carried out. The thickness of the horizontal metallic strip 147 may be substantially equal to the combined thickness of the layers of dielectric material 119, 124, 139, for example greater than 0.9 μm. In this example, the sixth metallic level M6 is the last level of metallic interconnection lines provided for the integrated circuit. The trenches whose walls have been covered by the MIM stack may be situated in a same plane parallel to the main plane of the substrate 100 as the horizontal metallic strips 147 of the last interconnection level M6.

In the case where the polishing previously mentioned has removed the layer of dielectric material 139, the latter may then be replaced. Another layer of dielectric material 154 is then deposited, for example, SiOC or $SiO_2$ based, and of a thickness for example of between 0.5 and 1 μm.

Figure 2D:
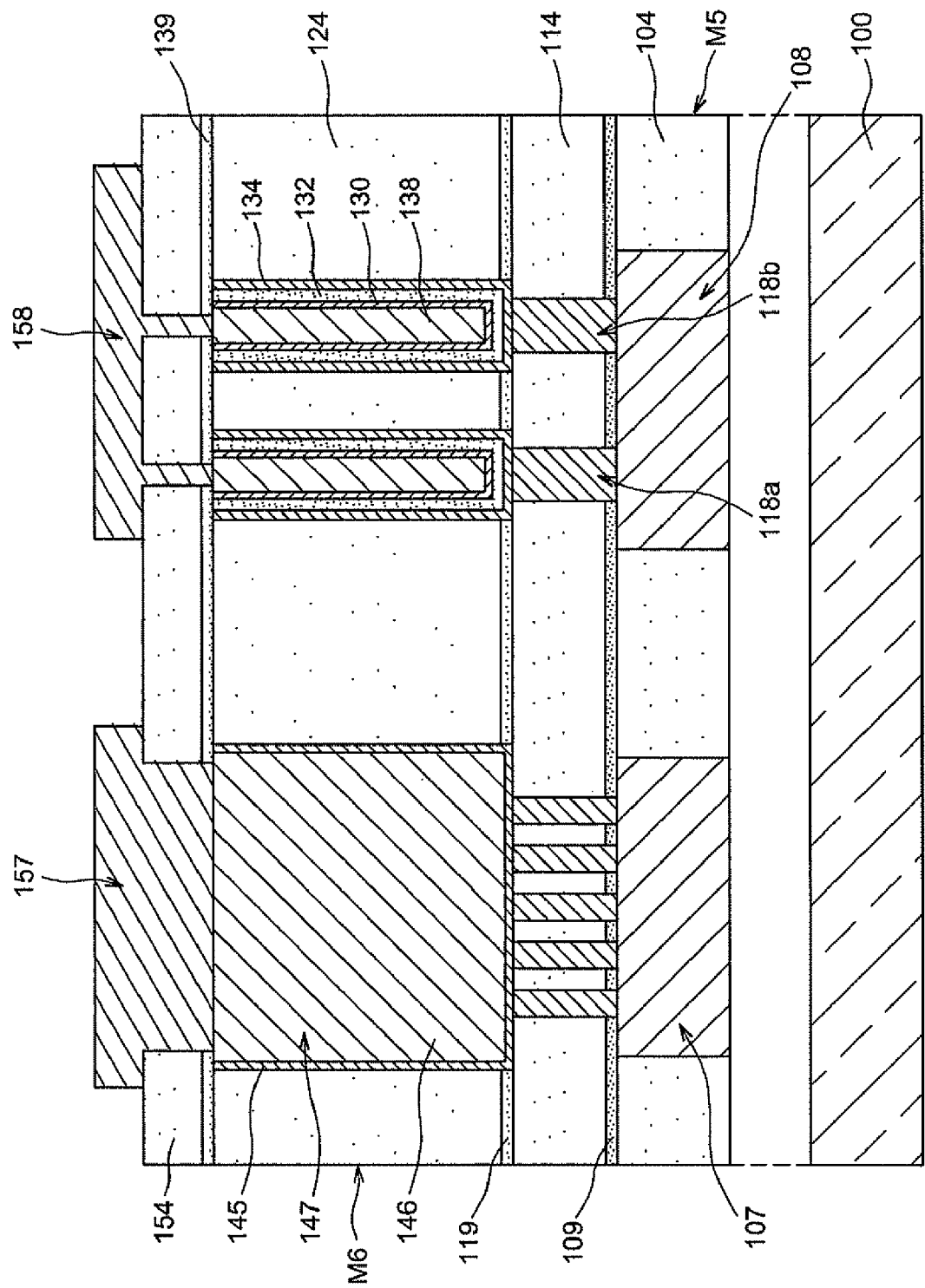

Next, a plurality of holes may be made in the layer of dielectric material 154, of which at least one hole reveals the thick metallic strip 147, and one or several holes respectively may reveal a trench filled with the MIM stack and metallic material 138. Then a given metallic material may be deposited, which may be different from the metallic material 138, in contact with the MIM stack and the metallic material based on which the metallic strip 147 is formed. The given metallic material is preferably a material that is resistant to oxidation phenomena, for example, aluminium. In the layer of given metallic material, for example aluminium based, a plurality of connection pads 157, 158 may be made, for example by photolithography then etching, comprising at least one pad in contact with the thick metallic strip 157, and at least one pad 158 in contact with one or several trenches filled with the MIM stack and the metallic material 138 (FIG. 2D).

Figure 1:
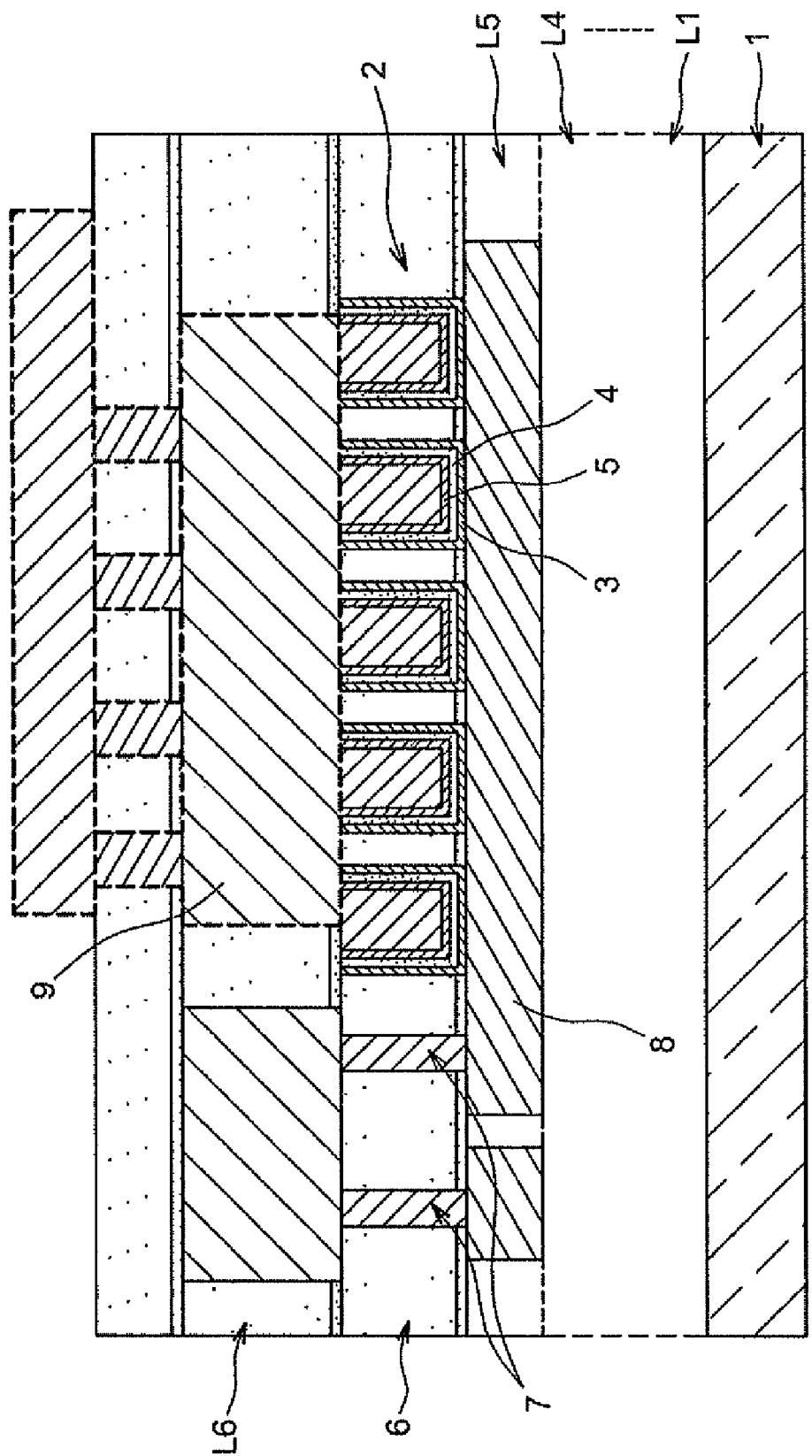
FIG. 1 illustrates an example of a micro-electronic device fitted with a 3 dimensional MIM capacitor fitted with vertical electrodes integrated between two metallic interconnection levels, in a same insulating layer as the metallic vias connecting these two levels, according to the prior art.

The micro-electronic device created using the method previously described, may thus be fitted with one or several capacitors with metallic electrodes respectively featuring at least one section forming an angle that is not nil with the main plane of the substrate and, for example, orthogonal to the main plane of the substrate 100. These sections of metallic electrodes may be created in a same insulating layer as the thick horizontal metallic lines of the last metallic level M6, which permits, at an equivalent size in a direction parallel to the main plane of the substrate, obtainment of a greater surface of electrodes than when the vertical sections of the electrodes are, for the device previously described in relation to FIG. 1, made in a same layer as the vias. The capacitor(s) of a micro-electronic device made using a method according to the invention may thus have, for an equivalent size in a direction parallel to the main plane of the substrate, a larger capacity than the capacitors of the device previously described in relation to FIG. 1. Integrating the MIM stack in a metallic level formed by horizontal metallic lines may also permit a reduced thickness to be maintained between this given level and the lower metallic level. In other words, such a mode of integration may be adapted to technologies for which it is increasingly demanded to reduce the height of the vias and the thickness of the insulating layers in which the vias are made and which separate two metallic levels.

Integrating the MIM stack in a metallic level, above the interconnection vias, may also permit the level of defects in the device to be reduced. Possible metallic outgrowths on the 5$^{th}$ level of metal may not affect the MIM capacitor, as contrary to the device of FIG. 1 previously described, this MIM stack is not directly formed on the 5$^{th}$ level of metal.

Figure 3:
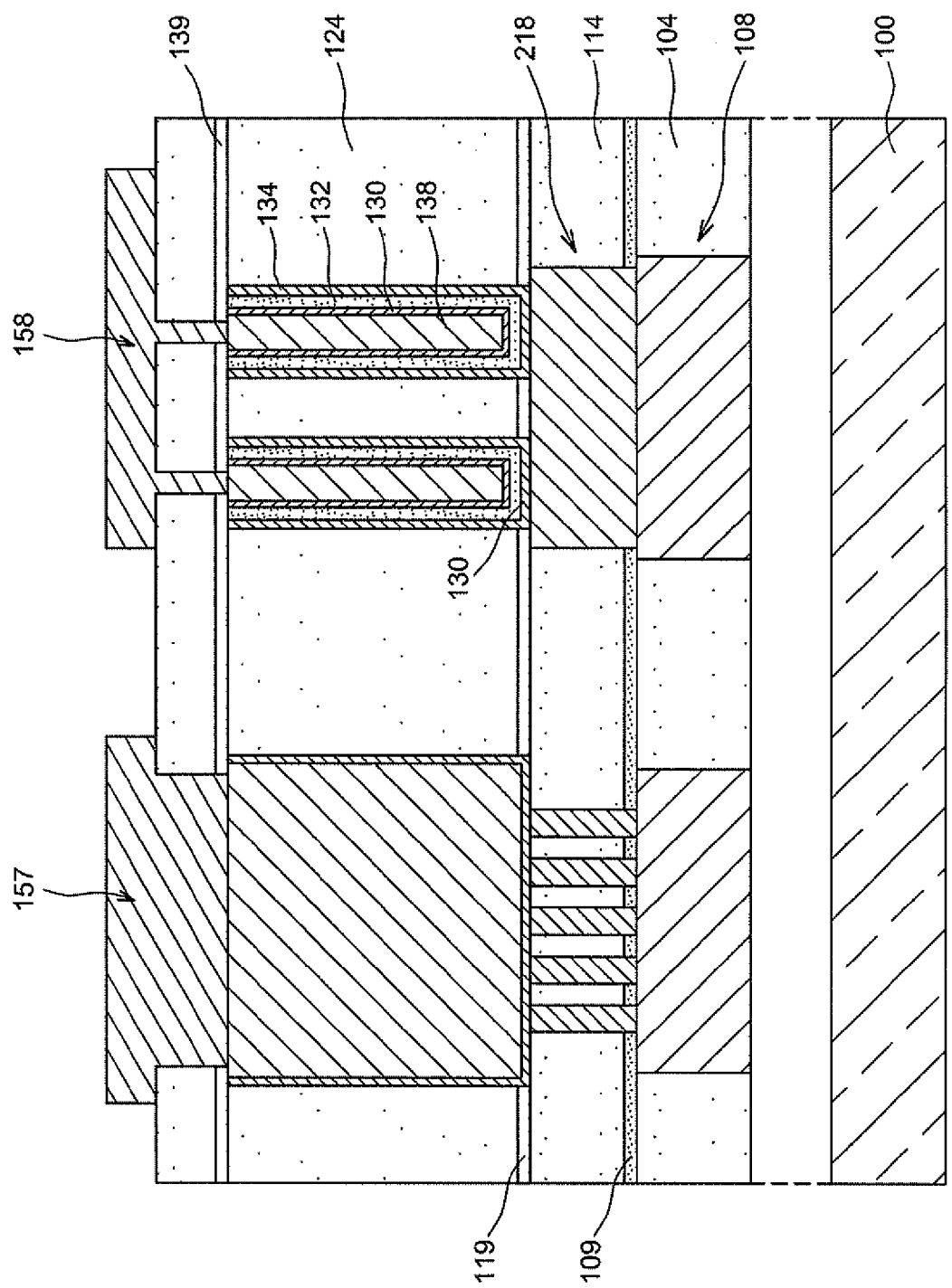
FIG. 3, illustrates a variant of the method provided in relation to FIGS. 2A-2D, FIGS. 4A-4B, illustrate another variant of the method provided in relation to FIGS. 2A-2D.

One variant of embodiment is provided in relation to FIG. 3. For this variant, the metallic elements 118*a*, 118*b* formed on the second metallic strip 108, may be replaced by a metallic block 218 with a larger critical dimension than that of the latter. The metallic block 218 may thus have a critical dimension greater than that of the metallic elements 117*a*, 117*b*, 117*c*, 117*d*, 117*e*, formed on the first horizontal metallic strip 107. The metallic block 218 may be made at the same time as the metallic elements 117*a*, 117*b*, 117*c*, 117*d*, 117*e*, by filling the insulating layer 109-114 with a metallic material such as copper. Next, several trenches 125*a*, 125*b*, may be formed so as to reveal the metallic block 218. The trenches 125*a*, 125*b*, may then filled as previously described in relation to FIG. 2B. Then the same steps as previously described in relation to FIGS. 2C and 2D may be carried out. At the end of the method, several trenches filled with the MIM stack may rest on the same metallic block 218, which itself may rest on a metallic strip 108 of the 5$^{th}$ level of metal.

Figure 4A:
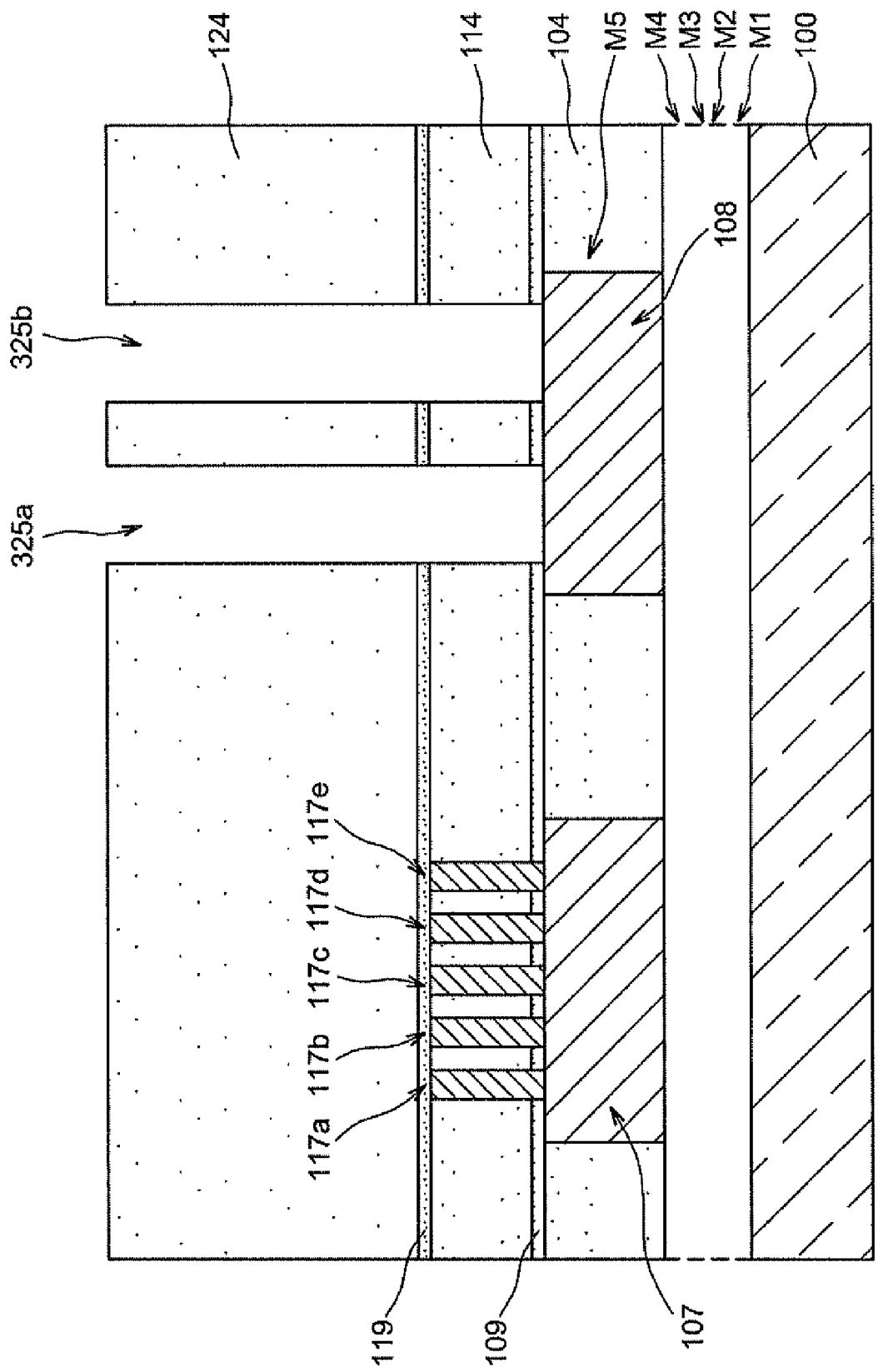
Figure 4B:
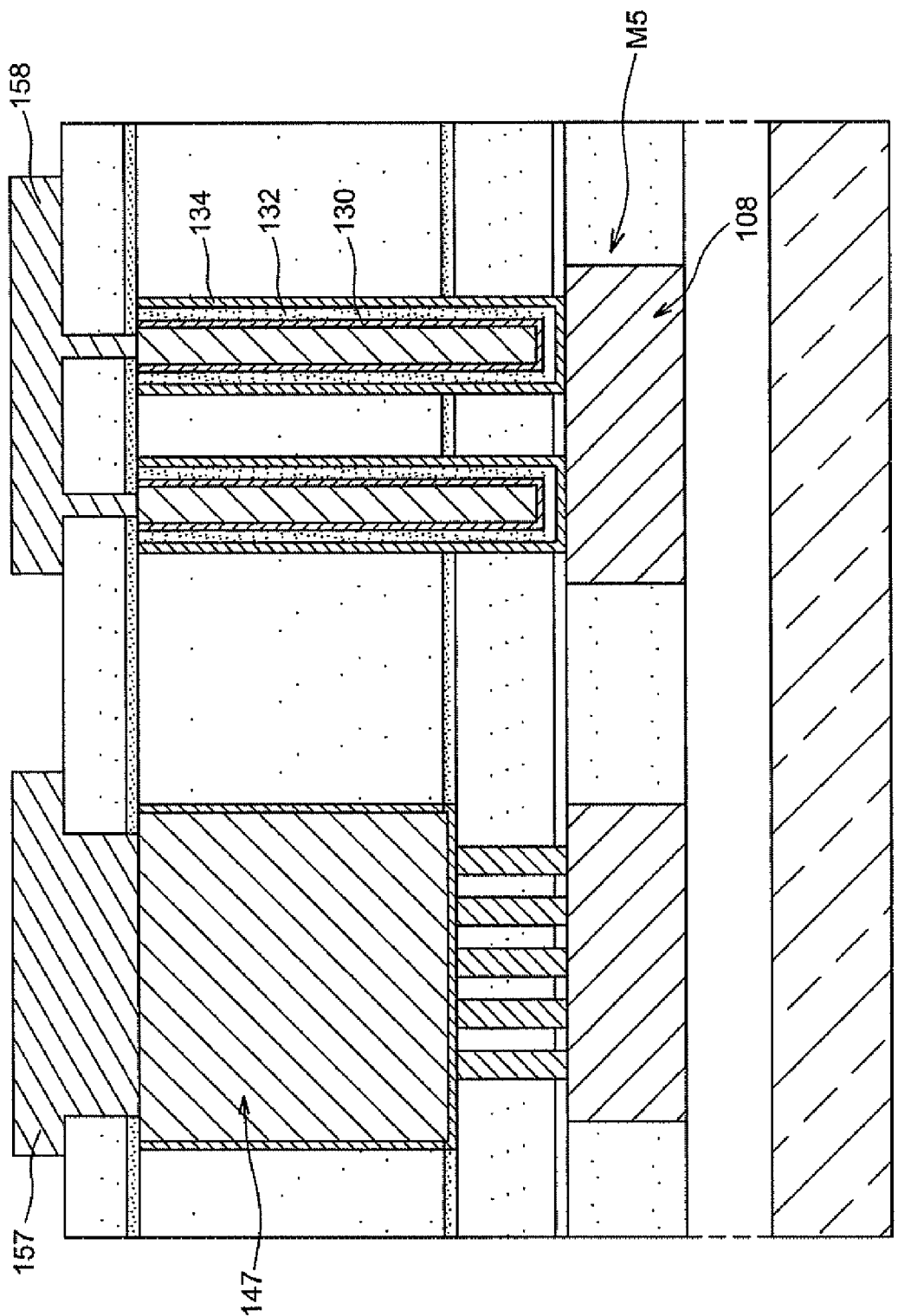

Another variant of embodiment is provided in relation to FIGS. 4A-4B. For this variant, the metallic elements 118*a*, 118*b* may not be made on the second metallic strip 108. During the step when the vias 117*a*, 117*b*, 117*c*, 117*d*, 117*e*, are formed, the insulating layer is left intact and may not be etched in a zone situated opposite the second metallic strip 108.

Next, for the step where trenches are formed in the insulating layer 119-124 opposite the metallic strip 108, trenches may also be made (references 325*a*, 325*b* in FIG. 4A), in the insulating layer 104-109, so that at the bottom of the trenches 325*a*, 325*b*, the second metallic strip 108 is revealed. The same steps as previously described in relation to FIGS. 2C and 2D may then be carried out. At the end of the method, several trenches filled with the MIM stack may rest on the metallic strip 108 of the 5$^{th}$ level of metal (FIG. 4B).

According to one variant of either of the methods previously described, the creation of the thick horizontal metallic strips 147 of the metallic level M6, by forming trenches in an insulating layer then filling the trenches with a metallic material, may be carried out before the formation of the MIM stack, wherein this stack is then formed by creating trenches in the insulating layer, then covering the walls and the bottom of the trenches of the MIM stack.

That which is claimed is:

1. A micro-electronic device comprising:
   a substrate and a plurality of metallic interconnection levels thereon, each comprising an insulating layer and at least one horizontal strip therein;
   the insulating layer of a given metallic interconnection level having at least one trench passing therethrough;
   a stack within the at least one trench and comprising a first metallic layer defining a first capacitor electrode, a dielectric layer on the first metallic layer, and a second metallic layer on the dielectric layer defining a second capacitor electrode; and
   at least one vertical connection element coupling the at least one horizontal strip of the given metallic interconnection level with the at least one horizontal strip of a lower metallic interconnection level.

2. A micro-electronic device according to claim 1, wherein a height of said at least one vertical connection element is less than a thickness of said insulating layer of the given metallic interconnection level.

3. A micro-electronic device according to claim 1, further comprising at least one metallic material filling the at least one trench and in contact with said second metallic layer.

4. A micro-electronic device according to claim 3, wherein said given metallic interconnection level is an uppermost metallic interconnection level and further comprising a plurality of metallic contact pads coupled thereto.

5. A micro-electronic device according to claim 1, wherein the at least one trench has a bottom; wherein said first metallic layer is adjacent the bottom of the at least one trench and coupled to the at least one horizontal metallic strip of the lower metallic interconnection level; and wherein the respective at least one horizontal metallic strips of the given and lower metallic interconnection levels are parallel to a main plane defined by said substrate.

6. A micro-electronic device according to claim 5, wherein said first metallic layer is in contact with said at least one vertical connection element.

7. A micro-electronic device according to claim 6, wherein said at least one vertical connection element comprises a metallic block.

8. A micro-electronic device according to claim 5, wherein said first thin metallic layer is in contact with said at least one horizontal metallic strip of the lower metallic interconnection level.

9. An integrated circuit comprising:
a substrate and a plurality of metallic interconnection levels thereon, each comprising an insulating layer and at least one horizontal strip therein;
the insulating layer of a given metallic interconnection level having at least one trench passing therethrough;
a stack within the at least one trench and comprising a first metallic layer defining a first capacitor electrode, a dielectric layer on the first metallic layer, and a second metallic layer on the dielectric layer defining a second capacitor electrode;
at least one vertical connection element coupling the at least one horizontal strip of the given metallic interconnection level with the at least one horizontal strip of a lower metallic interconnection level; and
at least one circuit module on said substrate and coupled to said first and second capacitor electrodes.

10. An integrated circuit according to claim 9, wherein said at least one circuit module comprises at least one of a RF module and an analog module.

11. An integrated circuit according to claim 9, wherein a height of said at least one vertical connection element is less than a thickness of said insulating layer of the given metallic interconnection level.

12. An integrated circuit according to claim 9, further comprising at least one metallic material filling the at least one trench and in contact with said second metallic layer.

13. An integrated circuit according to claim 12, wherein said given metallic interconnection level is an uppermost metallic interconnection level and further comprising a plurality of metallic contact pads coupled thereto.

14. An integrated circuit according to claim 9, wherein the at least one trench has a bottom; wherein said first metallic layer is adjacent the bottom of the at least one trench and coupled to the at least one horizontal metallic strip of the lower metallic interconnection level; and wherein the respective at least one horizontal metallic strips of the given and lower metallic interconnection levels are parallel to a main plane defined by said substrate.

15. A method of making a micro-electronic device comprising:
forming a plurality of metallic interconnection levels on a substrate, each comprising an insulating layer and at least one horizontal strip therein, the insulating layer of a given metallic interconnection level having at least one trench passing therethrough;
forming a stack within the at least one trench and comprising a first metallic layer defining a first capacitor electrode, a dielectric layer on the first metallic layer, and a second metallic layer on the dielectric layer defining a second capacitor electrode; and
coupling the at least one horizontal strip of the given metallic interconnection level to the at least one horizontal strip of a lower metallic interconnection level with at least one vertical connection element.

16. A method according to claim 15, wherein a height of the at least one vertical connection element is less than a thickness of the insulating layer.

17. A method according to claim 15, further comprising filling the at least one trench with at least one metallic material.

18. A method according to claim 15, wherein wherein the given metallic interconnection level is an uppermost metallic interconnection level and further comprising a plurality of metallic contact pads coupled thereto.

19. A method according to claim 15, wherein the at least one trench is formed to reveal a first metallic element adjacent the at least one horizontal metallic strip of the lower metallic interconnection level; and further comprising forming at least one other trench to reveal a second metallic element adjacent the at least one horizontal metallic strip of the lower metallic interconnection level.

20. A method according to claim 15, wherein the at least one trench is formed to reveal a first metallic element adjacent the at least one horizontal metallic strip of the lower metallic interconnection level; and further comprising forming at least one other trench to reveal the same metallic element.

21. A method according to claim 15, wherein the at least one trench reveals the at least one horizontal metallic strip of the lower metallic interconnection layer.

\* \* \* \* \*

UNITED STATES PATENT AND TRADEMARK OFFICE
CERTIFICATE OF CORRECTION

| | |
|---|---|
| PATENT NO. | : 7,796,372 B2 |
| APPLICATION NO. | : 12/061167 |
| DATED | : September 14, 2010 |
| INVENTOR(S) | : Cremer et al. |

It is certified that error appears in the above-identified patent and that said Letters Patent is hereby corrected as shown below:

Column 5, Line 55        Delete: "MG"
                         Insert: --M6--

Column 9, Line 41        Delete: "strips"
                         Insert: --strip--

Column 10, Line 23       Delete: "wherein wherein"
                         Insert: --wherein--

Signed and Sealed this
Twelfth Day of July, 2011

David J. Kappos
*Director of the United States Patent and Trademark Office*